US006998772B2

(12) United States Patent
Terumoto (10) Patent No.: US 6,998,772 B2
(45) Date of Patent: Feb. 14, 2006

(54) DOUBLE-SIDED ORGANIC ELECTROLUMINESCENT DISPLAY MODULE AND INFORMATION TERMINAL

(75) Inventor: Koji Terumoto, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 85 days.

(21) Appl. No.: 10/445,415

(22) Filed: May 27, 2003

(65) Prior Publication Data

US 2003/0227254 A1    Dec. 11, 2003

(30) Foreign Application Priority Data

Jun. 7, 2002    (JP) .............................. 2002-166656

(51) Int. Cl.
*H05B 33/00*    (2006.01)
(52) U.S. Cl. ..................................... 313/504
(58) Field of Classification Search ............... 313/498, 313/504, 506, 512
See application file for complete search history.

(56) References Cited

U.S. PATENT DOCUMENTS

| 3,037,138 | A  | * | 5/1962  | Motson ....................... 313/502 |
| 4,741,976 | A  | * | 5/1988  | Eguchi et al. .............. 428/690 |
| 6,476,552 | B1 | * | 11/2002 | Yoneda ....................... 313/506 |
| 6,771,020 | B1 | * | 8/2004  | Wang .......................... 313/506 |

* cited by examiner

*Primary Examiner*—Joseph Williams
(74) *Attorney, Agent, or Firm*—Hedman & Costigan, P.C.

(57) ABSTRACT

A double-sided organic electroluminescent display module capable of carrying out double-sided display includes two organic electroluminescent display elements each formed from at least a transparent electrode, an organic electroluminescent layer and a metal electrode layer laminated on a transparent substrate, wherein the two organic electroluminescent display elements are connected by connecting the metal electrodes together.

10 Claims, 7 Drawing Sheets

DOUBLE-SIDED ORGANIC ELECTROLUMINESCENT DISPLAY MODULE AND INFORMATION TERMINAL

BACKGROUND OF THE INVENTION

1. Field of the Invention

The present invention is related to an organic electroluminescent (hereafter "electroluminescent" is abbreviated as EL) display module and information terminal. Specifically, the present invention is related to a double-sided organic EL display module which is installed in an information terminal requiring a double-sided display, and an information terminal equipped with such double-sided organic EL display module.

2. Description of the Prior Art

With the spread of information terminals having an opening/closing portion such as portable telephones, notebook personal computers and the like, there has been a high demand to provide a display portion on both the front surface and the back surface of the opening/closing portion. On the other hand, spontaneous light emission type organic EL displays which are displays having high luminance at low power consumption are expected in display portions. In the prior art, in order to carry out display on both surfaces of the information terminal using organic EL display modules, two organic EL display modules need to be prepared for the front surface and the back surface.

Figure 7:
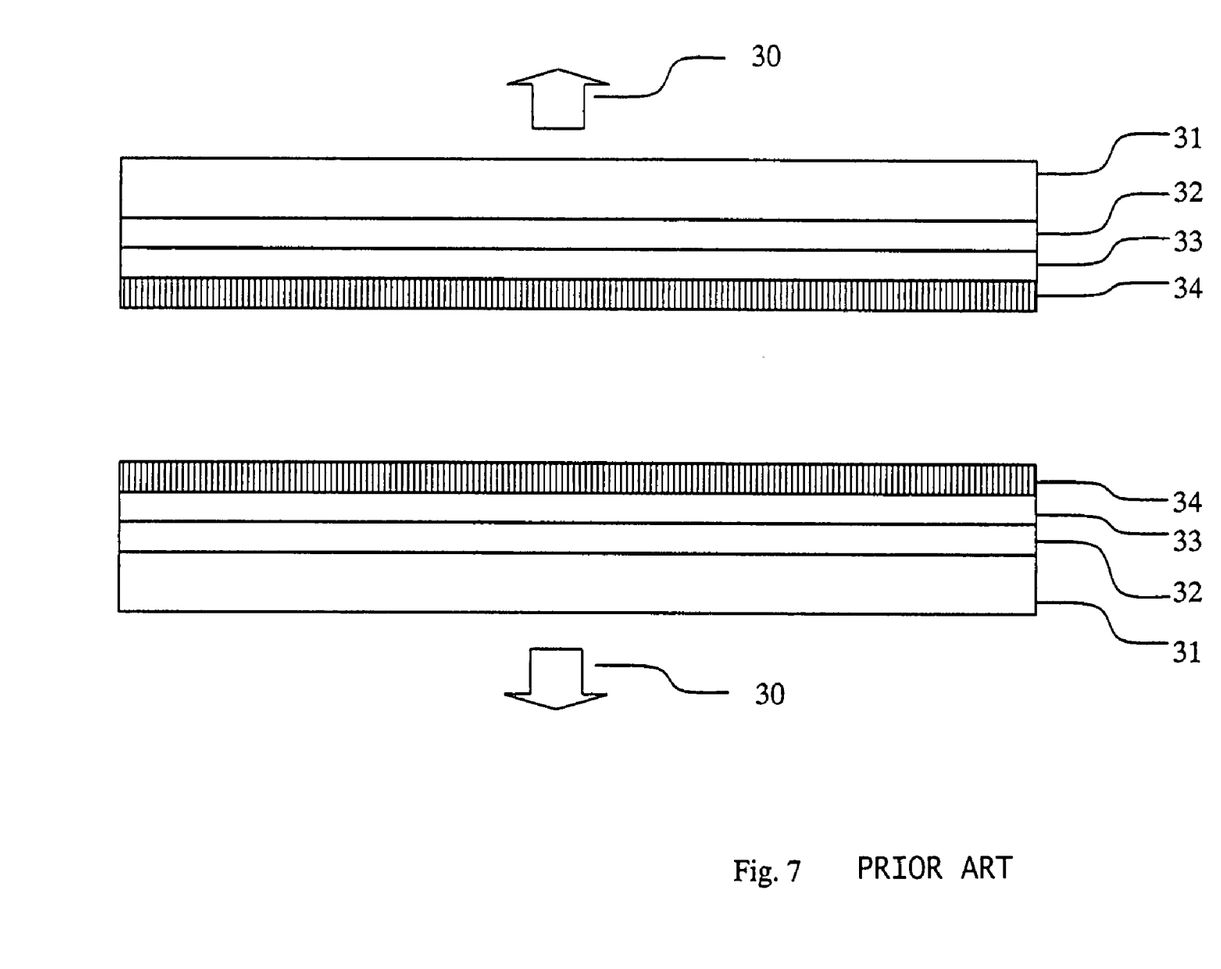
FIG. 7 is a structural view of a prior art organic EL element display module for double-sided display.

FIG. 7 shows the structure of a prior art organic EL element display module for double-sided display. In FIG. 7, 30 represents EL light, 31 represents glass substrates, 32 represents transparent electrodes, 33 represents organic EL layers, and 34 represents metal electrodes. Because the metal electrodes 34 use a metal in which electron filling is easy at a low work function as a cathode, it is difficult to make the metal electrodes 34 transparent. On the other hand, in a metal electrode used as an anode, because a metal in which hole filling is easy at a high work function is applied, it is possible to use a transparent metal such as ITO (Indium Tin Oxide) or the like. For this reason, the EL light 30 emitted by the organic EL layer 33 at the intersecting points of the transparent electrode 32 and the metal electrode 34 is emitted from the glass substrate 31 side. Because it is difficult to emit EL light from the metal electrode 34 side, in order to carry out display on both surfaces of the information terminal, the structure uses two separate organic EL display modules in which the metal electrodes 34 form back faces as shown in FIG. 7.

In the prior art organic EL display module structure described above, two organic EL display modules are needed to carry out display on both surfaces of the information terminal.

SUMMARY OF THE INVENTION

In order to solve the problems of the prior art described above, the present invention makes it possible to carry out double-sided display with only one organic EL display module. Further, it is an object of the present invention to provide an information terminal equipped with such organic EL display module.

In order to achieve the object stated above, the first invention of the present application is a double-sided organic EL display module which includes two organic EL display elements each formed from at least a transparent electrode, an organic EL layer and a metal electrode layer laminated on a transparent substrate, wherein the two organic EL display elements are connected by connecting the metal electrodes together.

The first invention of the present application includes a double-sided organic EL display module in which the electrode terminals of each of the two transparent electrodes and the electrode terminals of the metal electrodes are arranged on three different edges of the double-sided organic EL display module.

The second invention of the present application is a double-sided organic EL display module which includes at least a first transparent electrode, a first organic EL layer, a metal electrode layer, a second organic EL layer, and a second transparent electrode laminated on a transparent substrate.

The second invention of the present application includes a double-sided organic EL display module in which the electrode terminals of each of the two transparent electrodes and the electrode terminals of the metal electrode are arranged on three different edges of the double-sided organic EL display module.

The third invention of the present application is an information terminal equipped with the double-sided organic EL display module of the first invention or the second invention of the present application.

Further, the information terminal includes information terminals having a display portion such as a portable telephones, PDAs (PDA: Personal Digital Assistant), and cameras or the like.

DETAILED DESCRIPTION OF THE PREFERRED EMBODIMENTS

The preferred embodiments of the present invention will now be described in detail with reference to the appended drawings.

First Embodiment

Figure 1:
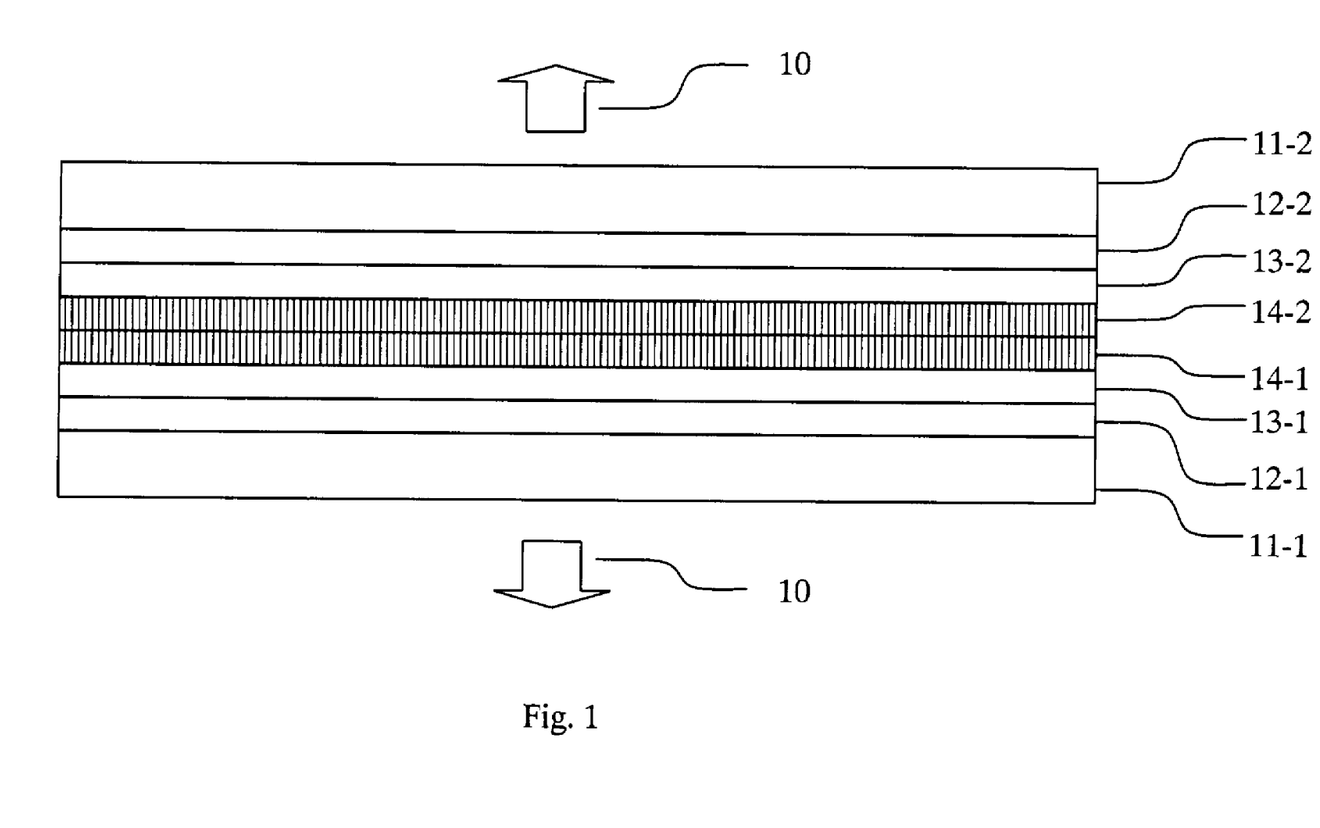
FIG. 1 is a cross-sectional view of the basic structure of a double-sided organic EL display module of the present invention.

The first embodiment of the present invention makes it possible to carry out double-sided display by laminating the metal electrodes of two organic EL display modules together. FIG. 1 shows a cross section of the basic structure of a double-sided organic EL display module according to the first embodiment of the present invention. In FIG. 1, 10 represents EL light, and 11-1, 11-2 represent glass substrates used as transparent substrates. In addition to the glass substrate, the substrate includes other substrates such as a flexible substrate, and a substrate formed from a color filter or a color changing material. Further, 12-1, 12-2 represent transparent electrodes. As for the transparent electrode material, it is possible to apply ITO, indium zinc oxide, tin oxide or the like. Further, 13-1, 13-2 represent organic EL layers formed from an electron transport layer, an organic EL emitter layer and a hole transport layer. Further, 14-1, 14-2 represent metal electrodes. As for the metal electrode material, it is possible to apply aluminum Al, lithium Li, magnesium Mg or an alloy of these metals.

The metal electrodes 14-1 and 14-2 are connected so that both electrodes are superposed with each other. When a voltage is applied between the metal electrode 14-1 and the transparent electrode 12-1, EL light is generated by the organic EL layer 13-1 at the intersecting points of the metal electrode 14-1 and the transparent electrode 12-1, and this EL light is emitted from the direction of the glass substrate 11-1. In the same way, when a voltage is applied between the metal electrode 14-2 and the transparent electrode 12-2, EL light is generated by the organic EL layer 13-2 at the intersecting points of the metal electrode 14-2 and the transparent electrode 12-2, and this EL light is emitted from the direction of the glass substrate 11-2. In this way, it becomes possible to display information on both surfaces of the organic EL display module.

Figure 2:
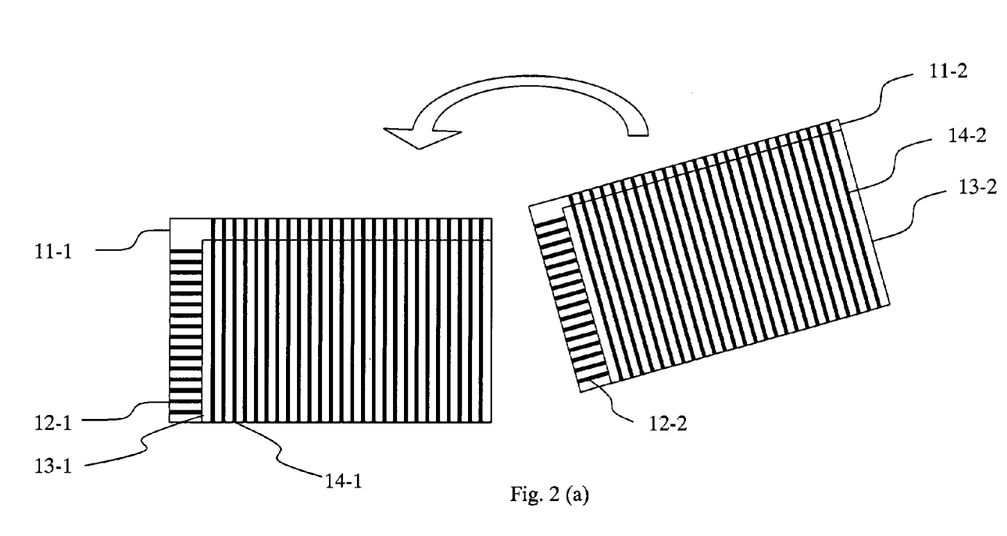
FIG. 2(a) is a structural view of a double-sided organic EL display module of the present invention.
FIG. 2(b) is a structural view of a double-sided organic EL display module of the present invention.

FIGS. 2(a) and 2(b) show the structure of the double-sided organic EL display module according to the first embodiment of the present invention. In FIGS. 2(a) and 2(b), 11-1, 11-2 represent glass substrates used as transparent substrates, 12-1, 12-2 represent transparent electrodes, 13-1, 13-2 represent organic EL layers, and 14-1, 14-2 represent metal electrodes.

As shown in FIG. 2(a), at least the transparent electrode 12-1, the organic EL layer 13-1 and the metal electrode 14-1 are formed in that order on top of the glass substrate 11-1 to construct one organic EL display element. The other organic EL display element is constructed in the same way by forming at least the transparent electrode 12-2, the organic EL layer 13-2 and the metal electrode 14-2 in that order on top of the glass substrate 11-2. These two organic EL display elements are laminated together so that the two metal electrodes 14-1 and 14-2 are superposed with each other. In such lamination, the terminal portions (the metal electrodes of the upper portion in FIG. 2(a)) of the metal electrodes 14-1 and 14-2 are bonded by a bonding agent having conductive particles mixed therein. When the terminal portions of the metal electrodes make contact by the conductive particles, it becomes possible to drive the metal electrodes from common terminals. In order to make it unnecessary to carry out precise positioning of the two organic EL display elements, an insulating layer or an insulating film may be provided between the two organic EL display elements to prevent the other portions of the metal electrodes outside the terminal portions from making contact. In order for the electrodes to have small resistance, and in order to strongly bond the two organic EL display elements, the other portions of the metal electrodes outside the terminal portions may be bonded by a bonding agent having conductive particles mixed therein so that contact is also made between such other portions. Further, an opaque film or a reflecting film may be provided between the two organic EL display elements so that the EL light emitted from both organic EL layers is emitted only from each glass substrate side.

FIG. 2(b) shows the double-sided organic EL display module in which two organic EL display elements are bonded together. As shown in FIG. 2(b), input wires from a driving circuit (not shown in the drawings) are connected to the terminal portion of the one transparent electrode 12-1 and the terminal portion (not visible in FIG. 2(b)) of the other transparent electrode 12-2. The terminal portion of the metal electrode 14-1 forms common terminals.

Figure 3:
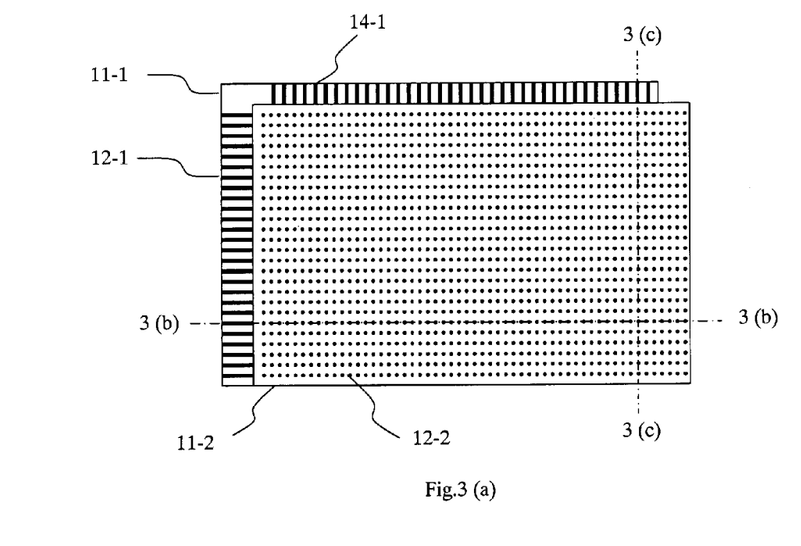
FIG. 3(a) is a basic structural view of a double-sided organic EL display module of the present invention.
FIG. 3(b) is a basic structural view of a double-sided organic EL display module of the present invention.
FIG. 3(c) is a basic structural view of a double-sided organic EL display module of the present invention.

FIGS. 3(a), 3(b) and 3(c) show the basic structure of the double-sided organic EL display module according to the first embodiment of the present invention. FIG. 3(a) is a plain view, FIG. 3(b) is a cross-sectional view taken along the lines 3(b)—3(b) in FIG. 3(a), and FIG. 3(c) is a cross-sectional view taken along the lines 3(c)—3(c) in FIG. 3(a). In FIGS. 3(a), 3(b) and 3(c), 10 represents EL light, 11-1, 11-2 represent glass substrates used as transparent substrates, 12-1, 12-2 represent transparent electrodes, 13-1, 13-2 represent organic EL layers, and 14-1, 14-2 represent metal electrodes. In FIGS. 3(a), 3(b) and 3(c), because pixels are formed by the intersecting points of the transparent electrode 12-1 and the metal electrode 14-1 in the organic EL layer 13-1 formed on top of the glass substrate 11-1, and because pixels are formed by the intersecting points of the transparent electrode 12-2 and the metal electrode 14-2 in the organic EL layer 13-2 formed on top of the glass substrate 11-2, it is possible to carry out double-sided display. Because the metal electrodes 14-1 and 14-2 have a common terminal portion as shown in FIG. 3(c), and because each of the transparent electrodes 12-1 and 12-2 has its own terminal portion, the double-sided organic EL display module has three different sets of electrode terminals, and when these electrode terminals are formed on shelf portions of the glass substrates, it becomes easy to connect the input wires from the driving circuit.

In the present embodiment, the two surfaces of the organic EL display module have the same size, but the present invention can be applied to the case where the two surfaces have different sizes.

Accordingly, compared to the situation in the prior art where two single-sided organic EL display modules are provided, the double-sided organic EL display module of the present invention can be made thin, and because the terminals of the metal electrodes are used in common, it is possible to reduce the number of input terminals.

Second Embodiment

Figure 4:
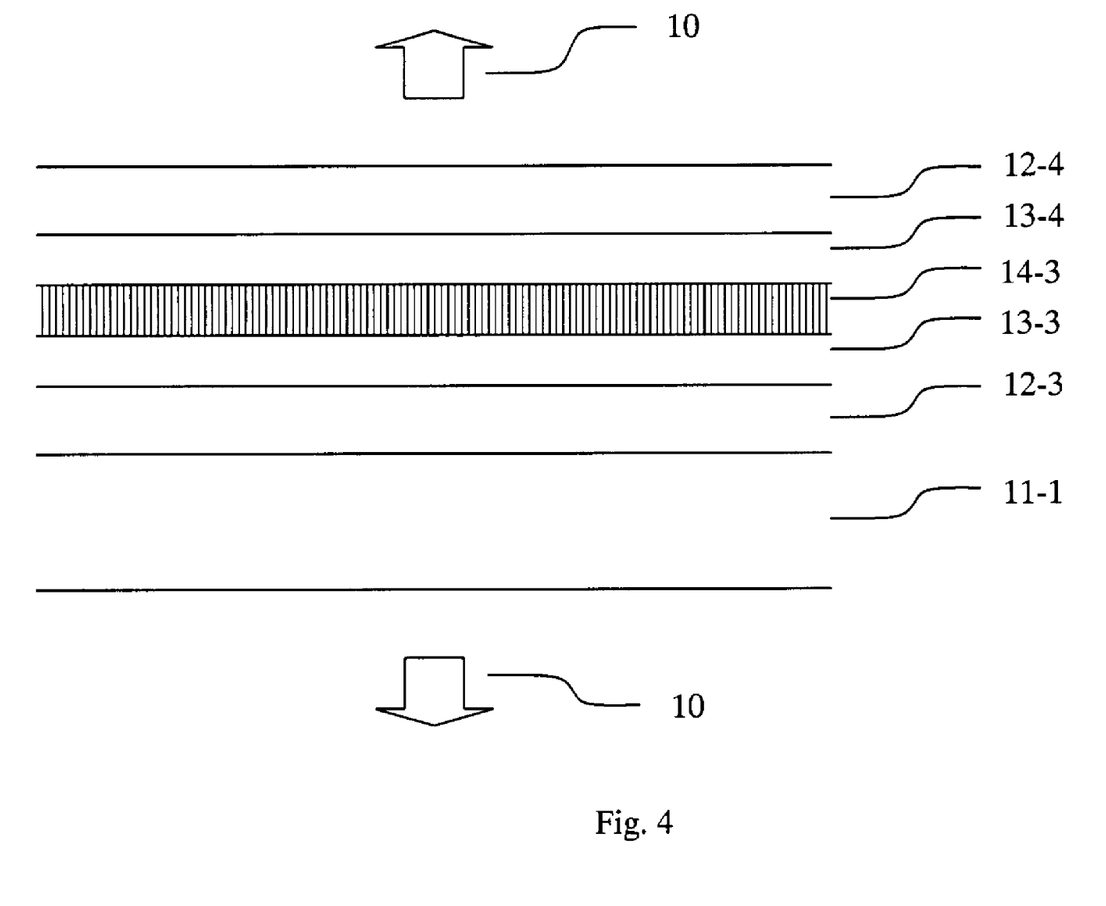
FIG. 4 is a cross-sectional view of the basic structure of a double-sided organic EL display module of the present invention.

The second embodiment of the present invention makes it possible to carry out double-sided display by providing two organic EL layers which generate light in an organic EL display module which has one metal electrode used in common. FIG. 4 shows a cross section of the basic structure of an organic EL display module capable of carrying out double-sided display according to the second embodiment of the present invention. In FIG. 4, 10 represents EL light, and 11-1 represent a glass substrate used as a transparent substrate. In addition to the glass substrate, the substrate includes other substrates such as a flexible substrate, and a substrate formed from a color filter or a color changing material. Further, 12-3 represents a first transparent electrode, and 12-4 represents a second transparent electrode. As for the transparent electrode material, it is possible to apply ITO, indium zinc oxide, tin oxide or the like. Further, 13-3 represents a first organic EL layer, and 134 represents a second organic EL layer, each of which is formed from an electron transport layer, an organic EL emitter layer and a hole transport layer. Further, 14-3 represents a metal electrode, and as for the metal electrode material, it is possible to apply Al, Li, Mg or an alloy of these metals. Further, a transparent protecting layer may be provided as needed on the top of the second transparent electrode 12-4 to seal or stabilize the surface.

The EL light generated by the first organic EL layer 13-3 at the intersecting points of the first transparent electrode 12-3 and the metal electrode 14-3 is emitted from the glass substrate 11-1 side. The EL light generated by the second organic EL layer 13-4 at the intersecting points of the second transparent electrode 12-4 and the metal electrode 14-3 is emitted from the second transparent electrode 12-4 side. The metal electrode 14-3 is used in common by the two organic EL layers 13-3 and 13-4. In this way, it becomes possible to display information on both surfaces of the organic EL display module.

Figure 5:
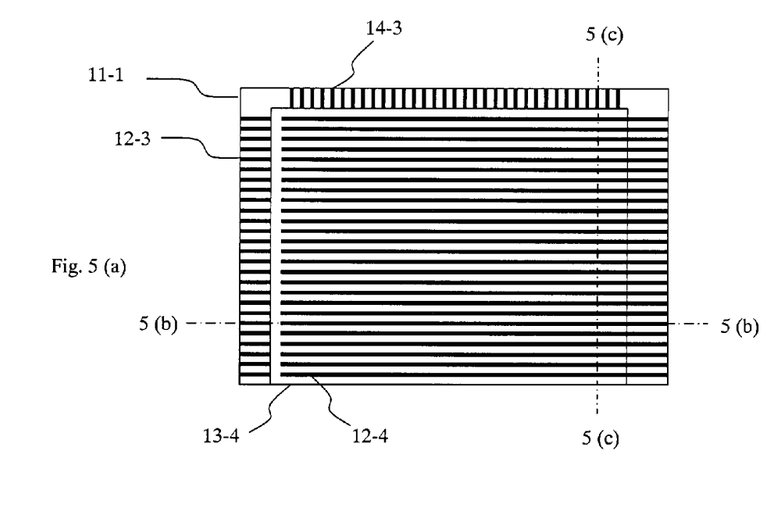
FIG. 5(a) is a basic structural view of a double-sided organic EL display module of the present invention.
FIG. 5(b) is a basic structural view of a double-sided organic EL display module of the present invention.
FIG. 5(c) is a basic structural view of a double-sided organic EL display module of the present invention.

FIGS. 5(*a*), 5(*b*) and 5(*c*) show the basic structure of the double-sided organic EL display module according to the second embodiment of the present invention. FIG. 5(*a*) is a plain view, FIG. 5(*b*) is a cross-sectional view taken along the lines 5(*b*)—5(*b*) in FIG. 5(*a*), and FIG. 5(*c*) is a cross-sectional view taken along the lines 5(*c*)—5(*c*) in FIG. 5(*a*). In FIGS. 5(*a*), 5(*b*) and 5(*c*), 11-1 represents a glass substrate used as a transparent substrate, 12-3 represents a first transparent electrode, 12-4 represents a second transparent electrode, 13-3 represents a first organic EL layer, 13-4 represents a second organic EL layer, and 14-3 represents a metal electrode. In FIGS. 5(*a*), 5(*b*) and 5(*c*), because pixels are formed by the intersecting points of the first transparent electrode 12-3 and the metal electrode 14-3 in the first organic EL layer 13-3 formed on top of the glass substrate 11-1, and because pixels are formed by the intersecting points of the second transparent electrode 12-4 and the metal electrode 14-3 in the second organic EL layer 13-4 formed on top of the metal electrode 14-3, it is possible to carry out double-sided display. As shown in FIGS. 5(*b*) and 5(*c*), because the metal electrode 14-3 is used in common by both organic EL layers 13-3 and 13-4, and because each of the first and second transparent electrodes 12-3 and 12-4 has its own terminal portion, the double-sided organic EL display module has three different sets of electrode terminals, and when these electrode terminals are formed on shelf portions of the glass substrate, it becomes easy to connect the input wires from the driving circuit.

In the present embodiment, the two surfaces of the organic EL display module have the same size, but the present invention can be applied to the case where the two surfaces have different sizes.

Accordingly, compared to the situation in the prior art where two single-sided organic EL display modules are provided, because all the elements are formed on one glass substrate, the double-sided organic EL display module of the present invention can be made thinner, and because the terminals of the metal electrode are used in common, it is possible to reduce the number of input terminals.

Third Embodiment

Figure 6:
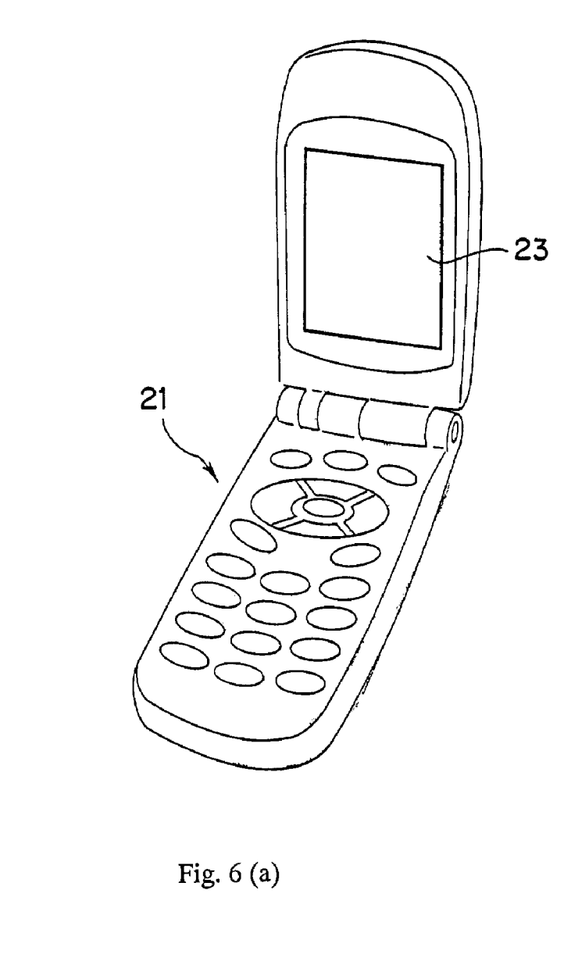
FIG. 6(a) is a rough sketch of a portable terminal equipped with a double-sided organic EL display module of the present invention.
FIG. 6(b) is a rough sketch of a portable terminal equipped with a double-sided organic EL display module of the present invention.

The third embodiment of the present invention is a portable terminal equipped with the double-sided organic EL display module described above. FIGS. 6(*a*) and 6(*b*) show a rough sketch of the portable terminal according to the third embodiment of the present invention. In FIGS. 6(*a*) and 6(*b*), 21 represents a portable terminal used as an information terminal, and 22, 23 are display portions. FIG. 6(*a*) is a sketch showing the outside of the portable terminal in the state where the cover portion is closed, and FIG. 6(*b*) is a sketch showing the outside of the portable terminal in the state where the cover portion is open.

One surface of the organic EL display module appears in the display portion 22 on the outside of the cover portion of the portable terminal 21, and the other surface of the organic EL display module appears in the display portion 23 on the inside of the cover portion of the portable terminal 21. Compared to portable terminals equipped with two prior art organic EL display modules, the portable terminal according to the present invention can be made thin. Further, because the double-sided organic EL display module described above has fewer input terminals, the installation space is small, and this makes it possible to construct a compact portable terminal.

As shown in FIG. 6(*a*), opposite top-bottom or left-right images are displayed on the display portion 22 when the cover portion of the portable terminal 21 is in a closed state, and on the display portion 23 when the cover portion is in an open state. In a portable terminal where both surfaces are not viewed at the same time, the open/closed state of the cover portion is detected, and display can be carried out by the display portion 22 in the state where the cover portion is closed, and display can be carried out by the display portion 23 in the state where the cover portion is open. An image inversion is suitably carried out by the driving circuit to correct the top-bottom or left-right orientation of the displayed image viewed by an observer. Further, in the case where both display portions are viewed in the state where the cover portion is open, it is possible to carry out display selectively on either display portion so that the image is corrected when viewed by an observer.

In the present embodiment, the two surfaces of the organic EL display module were described as having same sizes, but the present invention can be applied to the case where the two surfaces have the different size. Further, the present invention is not limited to just portable terminals, and it is possible to apply the present invention to any information terminal having a double-sided display function.

Accordingly, the information terminal equipped with the double-sided organic EL display module described above can be made thinner than the display portion of an information terminal equipped with two prior art organic EL display modules.

As described above, the present invention makes it possible to reduce the number of input terminals in the double-sided organic EL display module, and this makes it possible to construct a thin double-sided organic EL display module.

Furthermore, in a portable terminal equipped with the double-sided organic EL display module described above, it is possible to make the display portion thinner.

What is claimed is:

1. A double-sided organic electroluminescent display module, comprising:
    two organic electroluminescent display elements each formed from at least a transparent electrode having electrode terminals, an organic electroluminescent layer and a metal electrode layer having electrode terminals, said transparent electrode, organic electroluminescent layer and said metal electrode layer being laminated in that order on a transparent substrate wherein said display elements are arranged so that the metal electrode layers of each of said display elements are superposed on one another;

wherein the two organic electroluminescent display elements are electrically connected at a side of the metal electrodes.

2. A double-sided organic electroluminescent display module, comprising:

at least a first transparent electrode, a first organic electroluminescent layer, a non-transparent metal electrode layer, a second organic electroluminescent layer, and a second transparent electrode laminated in that order on a transparent substrate.

3. The double-sided organic electroluminescent display module of claim 1, wherein the electrode terminals of each of the two transparent electrodes and the electrode terminals of the metal electrodes are arranged on three different edges of the double-sided organic electroluminescent display module wherein said electrode terminals are parallel to the organic electroluminescent layer of the organic EL display module.

4. The double-sided organic electroluminescent display module of claim 2, wherein electrode terminals of each of the two transparent electrodes and electrode terminals of the metal electrode are arranged on three different edges of the double-sided organic electroluminescent display module wherein said electrode terminals are parallel to the organic electroluminescent layer of the organic EL display module.

5. An information terminal equipped with the double-sided organic electroluminescent display module of claim 1.

6. An information terminal equipped with the double-sided organic electroluminescent display module of claim 2.

7. An information terminal equipped with the double-sided organic electroluminescent display module of claim 3.

8. An information terminal equipped with the double-sided organic electroluminescent display module of claim 4.

9. A double-sided organic electroluminescent display module as defined in claim 1, comprising:

an opaque film between said display elements.

10. A double-sided organic electroluminescent display module as defined in claim 1, comprising:

a reflecting film between said display elements.

* * * * *